(12) United States Patent
Hempel (10) Patent No.: US 7,882,481 B2
(45) Date of Patent: Feb. 1, 2011

(54) WAFER LAYOUT OPTIMIZATION METHOD AND SYSTEM

(75) Inventor: Stefan Hempel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 474 days.

(21) Appl. No.: 12/025,213

(22) Filed: Feb. 4, 2008

(65) Prior Publication Data

US 2009/0007028 A1    Jan. 1, 2009

(30) Foreign Application Priority Data

Jun. 29, 2007    (DE)   ........................ 10 2007 030 051

(51) Int. Cl.
*G06F 17/50* (2006.01)
*G06F 19/00* (2006.01)

(52) U.S. Cl. .......................... 716/54; 716/56; 716/119; 700/97; 700/120; 700/121

(58) Field of Classification Search .................. 716/2, 716/9, 10, 21; 700/97, 120, 121
See application file for complete search history.

(56) References Cited

U.S. PATENT DOCUMENTS

| | | | | |
|---|---|---|---|---|
| 5,305,222 A | | 4/1994 | Nakamura | ................... 364/468 |
| 5,360,747 A | * | 11/1994 | Larson et al. | ................... 438/10 |
| 5,699,260 A | * | 12/1997 | Lucas et al. | ................... 700/121 |
| 5,874,189 A | | 2/1999 | Stroh et al. | ................... 430/22 |
| 6,113,646 A | * | 9/2000 | Holden | .......................... 716/4 |
| 6,374,149 B1 | * | 4/2002 | Subramanian | .............. 700/121 |
| 6,374,398 B1 | * | 4/2002 | Magee et al. | ................... 716/21 |
| 6,522,940 B1 | * | 2/2003 | Erck et al. | ..................... 700/121 |
| 6,529,790 B1 | * | 3/2003 | Magee et al. | ................ 700/121 |
| 6,778,876 B1 | * | 8/2004 | Coss et al. | .................... 700/121 |
| 6,980,917 B2 | * | 12/2005 | Ward et al. | .................... 702/120 |
| 6,992,767 B2 | * | 1/2006 | Matsumoto et al. | ......... 356/401 |
| 7,010,451 B2 | * | 3/2006 | Dorough et al. | ............. 702/117 |
| 7,353,077 B2 | * | 4/2008 | Lin et al. | ..................... 700/121 |

(Continued)

FOREIGN PATENT DOCUMENTS

| KR | 2002078658 A | * | 10/2002 |
|---|---|---|---|
| TW | 416099 A | * | 12/2000 |
| WO | WO 2004097528 A2 | * | 11/2004 |

OTHER PUBLICATIONS

Chien et al., "An Iterative Cutting Proced8ure for Determining the Optimal Wafer Exposure Pattern", IEEE Transactions on Semiconductor Manufacturing, vol. 12, No. 3, Aug. 1999, pp. 375-377.*

(Continued)

*Primary Examiner*—Phallaka Kik
(74) *Attorney, Agent, or Firm*—Williams, Morgan & Amerson, P.C.

(57) ABSTRACT

For determining an optimized wafer layout, at least two wafer layouts are specified for a given wafer, each wafer layout defining the location of a plurality of die with regard to the wafer. An optimization parameter value of at least one optimization parameter is determined for each of the at least two wafer layouts. The at least one optimization parameter includes at least one of a number of exposure fields necessary for exposing the respective wafer layout and a number of die of the wafer layout. The optimized wafer layout is selected out of the at least two wafer layouts depending on the optimization parameter values.

23 Claims, 5 Drawing Sheets

U.S. PATENT DOCUMENTS

| | | | |
|---|---|---|---|
| 7,385,700 B2 * | 6/2008 | Matsumoto et al. | 356/401 |
| 2004/0128630 A1 * | 7/2004 | Ward et al. | 716/2 |
| 2004/0180276 A1 * | 9/2004 | Tai et al. | 430/30 |
| 2006/0008716 A1 * | 1/2006 | Jeunink et al. | 430/30 |
| 2007/0027567 A1 * | 2/2007 | Lin et al. | 700/121 |
| 2008/0316504 A1 * | 12/2008 | Nemets et al. | 356/614 |

OTHER PUBLICATIONS

Kahn et al., "Enhanced Design Flow and Optimization for Multiproject Wafers", IEEE Transactions on Computer-Aided Design of Integrated Circuits and Systems, vol. 26, No. 2, Feb. 2007, pp. 301-311.*

Melzner, "Smaller is Better? Maximization of Good Chips per Wafer by Co-Optimization of Yield and Chip Area", The 17$^{th}$ Annual SEMI/IEEE Advanced Semiconductor Manufacturing Conference, May 22-24, 2006, pp. 372-379.*

Translation of Official Communication from German Patent Office for German Patent Application No. 10 2007 030 051.6-51 dated Mar. 12, 2008.

* cited by examiner

WAFER LAYOUT OPTIMIZATION METHOD AND SYSTEM

BACKGROUND OF THE INVENTION

1. Field of the Invention

The present disclosure generally relates to the field of integrated circuit manufacture and, more particularly, to a method and a system for optimizing a wafer layout.

2. Description of the Related Art

The formation of various integrated circuit (IC) structures on a wafer usually involves lithographic processes, sometimes referred to as photolithography or simply lithography. As is well known, lithographic processors can be used to transfer a pattern of a photomask (also referred to herein as a mask or a reticle) to a wafer. For instance, a pattern may be formed from a photoresist layer disposed on the wafer by passing light energy through a reticle having an arrangement to image the desired pattern of the respective level of the integrated circuit onto the photoresist layer. As a result, the pattern is transferred to the photoresist layer. Usually, after exposing a photoresist layer, a development cycle is performed, e.g., via an appropriate heat processing of the wafer. With some types of photoresist material, i.e., in areas where the photoresist is sufficiently exposed, the photoresist material may become soluble such that it may be selectively removed to expose an underlying layer, e.g., a semi-conductor layer, a metal or metal-containing layer, a dielectric layer, a hardmask layer, etc. Portions of the photoresist layer not exposed to a threshold amount of light energy will not be removed and serve to protect the underlying layer during further processing of the wafer. Further processing of the wafer may include, but is not limited to, etching exposed portions of the underlying layer, implanting ions into the wafer, etc. Thereafter, the remaining (protecting) portions of the photoresist layer may be removed.

There is an ongoing trend in IC fabrication to increase the density of the structures of the IC and, in particular, the density of the individual elements. As a result, there is a corresponding need to increase the resolution capability of lithography systems. Generally, the resolution of the lithography system is limited at least in part by the wave length used to expose portions of the photoresist. In particular, the finest resolvable or critical dimension is proportional to the wavelength of the light used for exposure. Another limiting factor is the numerical aperture, the critical dimension being inversely proportional to the numerical aperture. Accordingly, there has been a trend to reduce the wavelength as well as to increase the numerical aperture.

In modern systems, the reticle is not directly projected onto the wafer, but rather an imaging system is used to project the exposure pattern onto the wafer. Such an imaging system is capable of reducing the size of the structure defined by the reticle by a certain factor, e.g., a factor of 4 to 6. However, the imaging system cannot overcome the limitations imposed by the wavelength and the numerical aperture. Therefore, in order to further increase the resolution of the lithographic system, as an alternative to conventional dry lithography systems, an immersion lithography system has been proposed wherein the light is not transmitted through air or a vacuum from the imaging system to the wafer, but rather through an immersion lithography medium. Such an immersion lithography medium may be purified and de-ionized water. The immersion medium may be selected depending on the wavelength used for exposure. The immersion medium replaces an air or gas gap that is conventionally present between the final optical component of a conventional dry lithography imaging system and the wafer.

Usually, a wafer contains a plurality of individual devices (die). In order to increase the resolution and the quality of the exposure of the photoresist, a reticle is usually not configured for exposure of the whole wafer, but rather for exposure of only a part of the wafer, a so-called flash field or exposure field. For example, the reticle may include the structure of one device or a few devices, e.g., two or four devices. This means that, for exposing the whole wafer, the imaging system and the wafer have to be moved with respect to each other in order to expose the whole wafer step by step. Accordingly, systems of this type are usually referred to as steppers. Some steppers expose the whole reticle in one shot, whereas other types of lithographic systems only expose the whole width of the reticle at one time and exposure of the whole reticle is done by scanning the reticle in a direction perpendicular to its width.

One influence factor for cost efficiency in semiconductor manufacturing is the product yield. On the one hand, the quality of every single production step should be ideally set up getting the maximum yield out of the wafer. On the other hand, the total number of die that are positioned on one wafer is another important factor. Parameters which may influence this number of die are, for example, the wafer diameter, the wafer edge clearance, a shot clearance, the die dimension and the wafer layout itself, i.e., the arrangement of the die over the wafer.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a technique of providing at least two wafer layouts, calculating at least one optimization parameter for each of the wafer layouts and selecting one of the at least two wafer layouts depending on the optimization parameter values.

One illustrative method comprises specifying at least two wafer layouts for a wafer, each wafer layout defining the location of a plurality of die with regard to the wafer. The method further comprises determining an optimization parameter value of at least one optimization parameter for each of the at least two wafer layouts. The at least one optimization parameter includes at least one of a number of exposure fields necessary for exposing the respective wafer layout, wherein the exposure field is defined by a lithography tool and comprises at least one die, and a number of die of the wafer layout. The method further comprises selecting one of the at least two wafer layouts as an optimized wafer layout depending on the optimization parameter values.

Another illustrative method of optimizing a wafer layout comprises providing a predetermined geometry parameter set, which includes a die size and an available wafer field size of a wafer field. The wafer field of a wafer specifies an area to be used for die manufacturing. The method further comprises providing a predetermined die arrangement pattern, wherein a wafer layout is obtained by specifying a spatial relationship between the wafer and the die arrangement pattern, wherein the wafer layout includes all die of the die arrangement pattern exposable within the wafer field. An optimized wafer layout is provided by defining a respective optimized spatial relationship between the wafer and the die arrangement pattern by taking into account at least one of a number of exposure fields necessary to expose the optimized wafer layout on the wafer, wherein each exposure field is defined by a lithography tool and comprises at least one die, and a number of die of the optimized wafer layout in the wafer field.

One illustrative wafer layout system comprises a layout generator for generating at least two wafer layouts for a wafer, each wafer layout defining the location of a plurality of die with regard to the wafer. The wafer layout system further comprises an analyzer determining an optimization parameter value of at least one optimization parameter for each of the at least two wafer layouts. The at least one optimization parameter includes at least one of a number of exposure fields necessary for exposing the respective wafer layout and a number of die of the wafer layout. A decision unit is provided for selecting one of the at least two wafer layouts as optimized wafer layout, depending on the optimization parameter values.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

One factor influencing the cost efficiency in semiconductor manufacturing is the product yield. On the one hand, the quality of every single production step should be ideally set up getting the maximum yield out of the wafer. On the other hand, it has been found that geometry parameters have to be calculated in an optimized way using the maximum available wafer field size, i.e., in the wafer area that is used for die manufacturing, to get the maximum number of die per wafer.

Figure 1A:
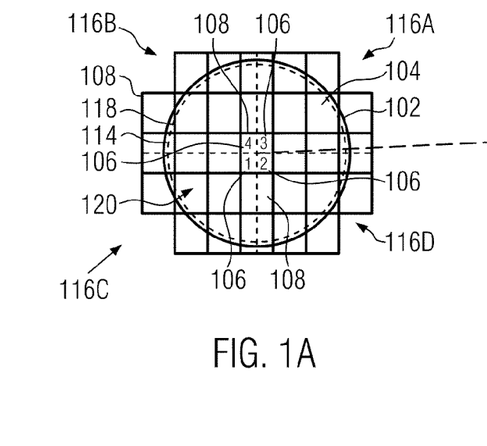
FIG. 1A schematically illustrates a wafer having a certain wafer layout according to one illustrative embodiment.
Figure 1B:
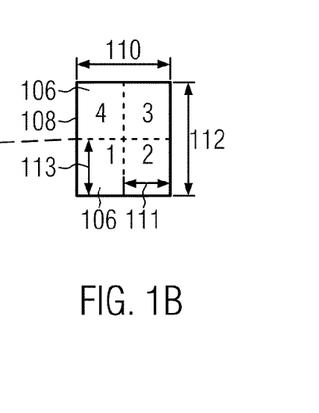
FIG. 1B schematically illustrates the structure of a exposure field in accordance with illustrative embodiments disclosed herein.

FIG. 1A shows in a schematic manner a wafer 102 and an overlaying wafer layout 104 which defines the location of die 106 on the wafer 102. It should be understood that the term "wafer layout" in this sense refers to a wafer layout 104 of a product, e.g., to the location of integrated circuits with respect to the wafer. The product comprises several well-aligned layers, each of which is separately exposed by a lithography tool. The wafer layout 104 specifies the lithography layout for the respective layer over the whole wafer 102. Modern integrated circuits require a very high lithography resolution. To meet this requirement, the wafer 102 is usually not exposed at once. Rather, the wafer 102 is exposed step by step, wherein each exposure step exposes an exposure field 108. FIG. 1B shows the exposure field 108 used for the wafer layout 104 of FIG. 1A in greater detail. The illustrative exposure field 108 depicted in FIGS. 1A-1B has four die 106. The exposure field has a width $x_{Field}$ 110 and a height $y_{Field}$ 112.

Geometric parameters which may influence the maximum number of die per wafer may include the wafer diameter $D_{Wf}$ and the diameter $D_{EE}$ of wafer edge exclusion. The diameter of wafer edge exclusion $D_{EE}$ defines the wafer edge clearance 114 radially outside $D_{EE}$. Further, the diameter $D_{EE}$ of wafer edge exclusion defines a wafer field 118 radially inside $D_{EE}$ to be used for die manufacturing. Instead of the wafer edge clearance or in addition to the wafer edge clearance, a shot clearance may be taken into account as a geometric parameter. The shot clearance describes a circle on the wafer, wherein a lithography tool is able to expose an exposure field, the inner corner next to the center of the wafer lies within the shot clearance. Some lithographic tools do not have such a limitation. Usually a diameter of shot clearance lies between the wafer edge and the diameter of wafer edge exclusion. Another geometrical parameter is die width $x_{Die}$ 111 and a die height $y_{Die}$ 113. Another geometric parameter is the number of die $n_x$ within the exposure field in an x-direction and the number of die in a y-direction:

$$n_x = \left\lfloor \frac{x_{Field}}{x_{Die}} \right\rfloor$$

$$n_y = \left\lfloor \frac{y_{Field}}{y_{Die}} \right\rfloor$$

wherein the brackets $\lfloor \ldots \rfloor$ denote the formation of an integer via round down. With reference to FIG. 1A, exposure fields may be located within the usable wafer field 118 defined by the diameter of wafer edge exclusion $D_{EE}$ and on the wafer edge 114. Accordingly, this equally applies to single die, i.e., according to an illustrative embodiment, the exposure field may comprise only one single die.

The wafer 102 comprises four quarters, quarter one 116A, quarter two 116B, quarter three 116C and quarter four 116D. According to one illustrative embodiment, the number of die is separately determined for each of the quarters 116A, 116B, 116C and 116D. This is illustrated in FIGS. 3A-3D.

The following definitions apply to the calculations below:
The number of die within the wafer field, i.e., within $D_{EE}$, is denoted as $N_{Die}$
The number of exposure fields is denoted as $N_{Field(Die)}$
The number of die for complete wafer coverage is denoted by $N_{Die\&Edge}$
The number of exposure fields for complete wafer coverage is denoted by $N_{Field(Die\&Edge)}$ To calculate the respective numbers of an optimized solution, i.e., an optimized wafer layout, the calculation algorithm has to be worked through several times.

In order to optimize a wafer layout, according to illustrative embodiments, at least two wafer layouts are specified for a wafer, wherein each wafer layout defines the location of a plurality of die 106 with regard to the wafer 102. The optimization of the wafer layout is performed by using at least one optimization parameter. An optimization parameter may be, for example, a number of exposure fields 108 necessary for exposing the respective wafer layout 104 wherein the exposure field 108 is defined by a lithography tool and comprises at least one of the die 106.

It should be understood that the number of exposure fields may be calculated in different ways. According to an illustrative embodiment, denoted as (A) in the following, to the number of exposure fields contribute:
all exposure fields of which all die are yielding die (denoted as full field exposure or full shot); and
all exposure fields of which not all die but at least one die is a yielding die (denoted as partial field exposure or partial shot).

According to another illustrative embodiment, denoted as (B) in the following, to the number of exposure fields contribute:
all exposure fields of which reside at least partially on the wafer (denoted as full wafer coverage).

There are product specific layers of a product, denoted as (A) layers in the following, in the wafer production, which are exposed according to (A) and are then processed further. Other product specific layers of the product, denoted as (B) layers in the following, may require exposure according to (B). According to one illustrative embodiment, depending on the number of (A) layers and the number of (B) layers of a product, it may be decided whether the (A) layers are used for optimizing the wafer layout, whether the (B) layers are used for optimizing the wafer layout or whether the (A) layers and the (B) layers are used for optimizing the wafer layout. According to another illustrative embodiment, the number of exposure fields of an (A) layer and the number of exposure fields of a (B) layer are taken into account for optimizing the wafer layout. For example, depending on the number of (A) layers and the number of (B) layers of a product, it may be decided whether the number of exposure fields of an (A) layer are taken into account with a higher priority or whether the number of exposure fields of a (B) layer are taken into account with a higher priority.

Another possible optimization parameter is the number of die of the wafer layout. The number of die of the wafer layout may be, for example, the number of die which are completely located within the wafer field 118. The optimization is performed by determining an optimization parameter value of the at least one optimization parameter for each of at least two wafer layouts. According to one illustrative embodiment, the number of die of the wafer layout may be the optimization parameter with the highest, first priority. According to another illustrative embodiment, one of the number of exposure fields of the (A) layers or the number of exposure fields of the (B) layers is taken into account with a lower, second priority and the other of the number of exposure fields of the (A) layers or the number of exposure fields of the (B) layers is taken into account with a still lower, third priority.

According to one illustrative embodiment, the priority of at least some of the optimization parameters may be directly input by a user. According to another embodiment, the priority of at least some of the optimization parameters are automatically determined by a respective wafer layout system, for example, depending on user inputs or preset by the wafer layout system. For example, according to another illustrative embodiment, the number of die of the wafer layout is taken into account with the highest priority and the user is requested to provide an input in response to which the wafer layout system selects among the number of exposure fields of the (A) layers and the number of exposure fields of the (B) layers one number of exposure fields to have the second priority and the other number of exposure fields to have the third priority.

The at least two wafer layouts may be determined by any appropriate method, e.g., by the method disclosed hereinafter. Depending on the optimization parameter values, one of the at least two wafer layouts is selected as an optimized wafer layout. For example, if only one optimization parameter is used, the wafer layout having the best optimization parameter value may be selected. If two or more optimization parameters are taken into account, for example, if the number of exposure fields as well as the number of die of the wafer layout are taken into account as optimization parameters, any appropriate method for taking into account the values of the two or more optimization parameters may be employed. For example, a optimized wafer layout may be selected as follows: In a first step, a predetermined number of layouts having the highest optimization parameter value of a first optimization parameter out of the at least two optimization parameters may be preselected. Among these preselected wafer layouts, the wafer layout having the best optimization parameter value of another, second optimization parameter may be selected as the optimized wafer layout.

According to various illustrative embodiments, the die of the at least two wafer layouts are arranged in parallel with respect to an x-axis and a y-axis of a Cartesian coordinate system. For example, the die may be arranged in parallel with respect to a wafer stage coordinate system of a lithography system. According to other embodiments, the die may be arranged in parallel with respect to a coordinate system of a lithography tool of the lithography system.

The wafer layouts taken into account for selecting the optimized wafer layout may differ from each other by a translatory displacement. According to other embodiments, the at least two wafer layouts may differ from each other by a rotational displacement. According to still other embodiments, the two wafer layouts may differ from each other by a translatory displacement and a rotational displacement.

Figure 2A:
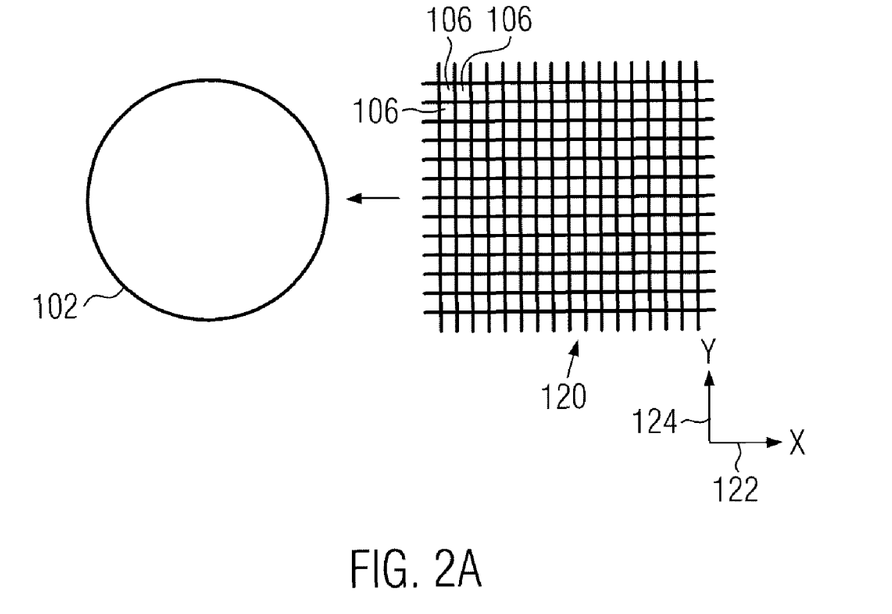
FIG. 2A schematically illustrates a method of wafer layout generation according to various illustrative embodiments.

For example, as illustrated in FIG. 2A, there may be provided a predetermined die arrangement pattern 120 which defines the arrangement of die 106 with respect to each other independently of a wafer 102. A wafer layout is then generated by superimposing the die arrangement pattern 120 and a certain wafer 102. According to illustrative embodiments, this superimposing of the die arrangement pattern 120 and the wafer 102 is performed by means of a respectively programmed computer, resulting in a desired number of wafer layouts which may be taken into account for selecting an optimized wafer layout.

Figure 2B:
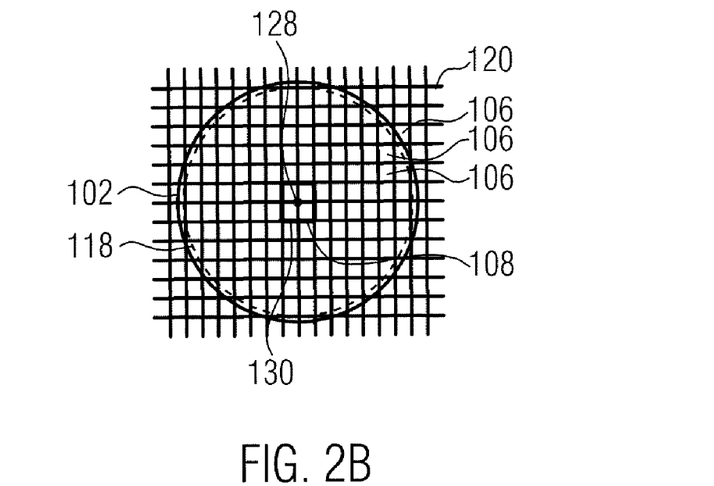
FIG. 2B schematically illustrates a wafer layout generated according to the method illustrated in FIG. 2A.

FIG. 2B shows the wafer 102 with the superimposed die arrangement pattern 120, thereby defining the location of the die 106 with respect to the wafer 102. The spatial relationship between the wafer 102 and the die arrangement pattern 120 defines a specific wafer layout of the die 106 with respect to the wafer 102. According to illustrative embodiments, the die arrangement pattern defines the positions of the die 106 parallel to an x-axis and parallel to a y-axis of a Cartesian coordinate system, as illustrated in FIGS. 2A-2B. However, it should be understood that the die arrangement pattern may define the positions of the die 106 in any other manner, e.g., in an irregular manner. It should be understood that, according to illustrative embodiments, the relative position of groups of die which are defined by the reticle in the lithography tool may be maintained constant over the whole wafer. This allows the exposure of the whole wafer layout with a single reticle. According to other illustrative embodiments, the die 106 do not have to have the same size throughout the die arrangement pattern. For example, some of the die 106 may include additional structures, e.g., test structures for testing specific properties of individual elements of the regular integrated circuit of the die 106. However, in illustrative embodiments shown in FIG. 2A-2B, the die arrangement defines only a single kind of die 106 and the arrangement of the die 106 is regular and parallel to an x-axis 122 and a y-axis 124 of a Cartesian coordinate system 126. The die shown in FIGS. 2A-2B each include the desired integrated circuit as well as such additional structures.

According to illustrative embodiments, there is provided a plurality of wafer layouts differing from each other by a translatory shift. To define the translatory shift, an arbitrary point of the die arrangement pattern 120 may be defined as a reference point. For example, as illustrated in FIG. 2B, a crossing where corners of four adjacent die 106 meet may be defined as reference point 128. According to illustrative embodiments, the reference point 128 is defined in the center of an exposure field 108. In FIG. 2B, only a single exposure field 108 is illustrated by a bold rectangle. However it should be understood that the whole wafer layout may be exposed by the exposure field 108. According to illustrative embodiments, the reference point 128 may be used as starting point for the calculation of the number of die or the number of exposure fields.

According to illustrative embodiments, the translatory shift of the die arrangement pattern 120 with respect to the wafer 102 is within a shifting area 130 for all wafer layouts. According to further illustrative embodiments, the shifting area 130 corresponds in size to the exposure field 108. In FIG. 2B, the coordinate system of the wafer, e.g., the coordinate system of a wafer stage has its origin in the center of the wafer. Further, the origin of a coordinate system of the die arrangement pattern 120 may be selected to correspond to the origin of the coordinate system of the wafer stage for an initial configuration illustrated in FIG. 2B. Hence, the reference point 128 may be located in the center of the wafer in the initial configuration shown in FIG. 2B, where the shift is zero in the x-direction and is zero in the y-direction. Hence, according to illustrative embodiments, a plurality of wafer layouts may be generated by shifting the die arrangement pattern 120 such that the reference point 128 is within the shifting area 130 for each wafer layout. It should be understood the shift $(x_s, y_s)$ of the die arrangement pattern 120 causes a respective shift of the reference point 128.

According to illustrative embodiments, the positions of the reference point 128 are equidistantly spaced over the shifting area 130. For example, the shifting area may be divided into a predetermined number of shifting area portions along each of the x-axis and the y-axis of the respective coordinate system.

The coordinate system of the die arrangement pattern 120 may correspond to the coordinate system of a lithography tool. It should be understood that the stepping movement of the lithography tool moves the exposure field 108 of the lithography tool over the wafer in predetermined steps, thus defining the die arrangement pattern. Hence according to illustrative embodiments, shifting the wafer stage coordinate system against the coordinate system of the lithography tool corresponds to the above-discussed translatory shift of the die arrangement pattern with respect to the wafer, leading to the respective wafer layouts. Hence, the number of die $N_{Die}$ and the number of exposure fields $N_{Field(Die)}$ can vary for the different wafer layouts generated in this way.

To determine the optimized coordinate system offset, one of the coordinate systems, e.g., the wafer stage coordinate system, will be shifted within the shifting area with a predetermined increment, according to an illustrated embodiment. Every translatory shift results in a new starting point $P_s(x_s, y_s)$ for a new die and can count calculation. In illustrative embodiments where the shifting area corresponds in size to the exposure field, the shifting area depends on the particular geometry of the exposure field and, hence, of the die.

The shifting area and its x dimension and y dimension may be mathematically described with regard to the wafer stage coordinate system origin P(0,0) as $$P_x[-x_{Field}/2; x_{Field}/2] \; P_y[-y_{Field}/2; y_{Field}/2].$$

According to illustrative embodiments, this shifting area is divided into a first number of x increments and a second number of y increments. For example, the shifting area may be divided into $10^3$ x increments and $10^3$ y increments which result in $10^6$ starting points and in $10^6$ calculation results. The first and second number of increments are model variables which may be set by the user. For example, a respective user interface may be provided which allows the user to set the increments in the x direction as well as in a y direction. The number of x increments may be equal to the number of y increments, as described above. According to other illustrative embodiments, the number of x increments differs from the number of y increments. According to illustrative embodiments, the x increments are of the same magnitude as the y increments.

It should be noted that although the illustrative embodiments discussed with regard to FIG. 2A refer to a die arrangement pattern 120, according to other embodiments, an exposure field arrangement pattern may be shifted with regard to the wafer 102 to determine different wafer layouts. However, since every exposure field corresponds to a well-defined arrangement of a group of at least one die, the specification of a exposure field arrangement pattern implicitly specifies a respective die arrangement pattern.

Figure 3A:
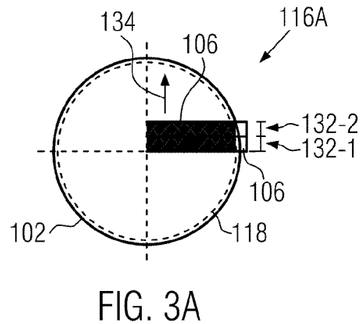
FIGS. 3A-3D illustrate in a schematic manner the counting of die of a wafer layout in accordance with illustrative embodiments disclosed herein.
Figure 3B:
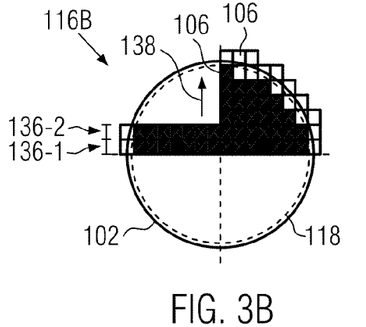
Figure 3C:
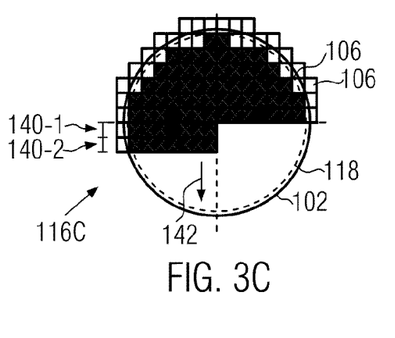
Figure 3D:
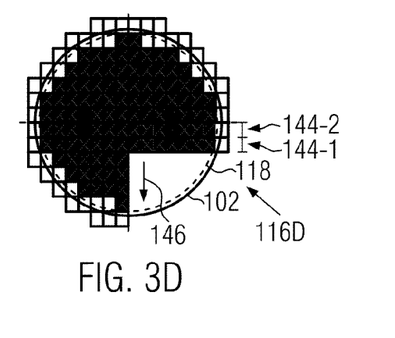

In the following, a calculation example will be given for the computing of the number of die and exposure fields for respective wafer layouts starting with a starting point $P_s$ $(x_s, y_s)$. According to an illustrative embodiment, in a first step, the number of die per quarter calculation principles of illustrative counting algorithms are schematically illustrated in FIGS. 3A-3D. According to an illustrative embodiment, the die counting is performed level-wise for every quarter 116A, 116B, 116C, 116D separately. Herein, level-wise refers to a line 132-1, 132-2 of die along the x-axis. As illustrated in FIG. 3A, in a first step, the number of die of the first quarter 116A is counted. Herein the die 106 which count to $N_{Die}$, i.e., the die 106 which are within the wafer field 118, are illustrated in black, whereas the die 106 which extend beyond the wafer field 118 and are counted to the number of die for complete wafer coverage $N_{Die\&Edge}$ are illustrated in white. The counting procedure is as follows: First, the first level 132-1 of the first quarter 116A is counted. Thereafter, the second level 132-2 of the first quarter 116A is counted, and so on, as indicated by arrow 134. After completing the first quarter 116A, the die of the second quarter 116B are counted in the same manner. That is, the first level 136-1 of the second quarter 116B is counted first, then the second level 136-2 of the second quarter 116B is counted, and so on, as indicated by the arrow 138. After completing the second quarter 116B, the die of the third quarter 116C are counted in the same manner, as illustrated in FIG. 3C. Accordingly, the first level 140-1 is counted first, then the second level 140-2 of the third quarter 116C is counted, and so on, as illustrated by the arrow 142. After finishing the third quarter 116C, the die of the fourth quarter 116D are counted in the same manner, as illustrated in FIG. 3D. Accordingly, the first level 144-1 is counted first, then the second level 144-2 is counted, and so on, as indicated by the arrow 146.

It should be noted that, according to one illustrative embodiment, the first die that is counted is the die of the first quarter which is located adjacent the center of the wafer. It should further be noted that the quarters of the wafer have been denoted in a specific manner with regard to illustrative embodiments, which are in no way limiting the invention. In particular, the counting may start with any other quarter of the wafer 102. It should further be noted that according to illustrative embodiments, the counting may start with any die 106 adjacent to the center of the wafer 102 in the unshifted configuration. For example, according to further illustrative embodiments, the counting may start with any die 106 which in the unshifted configuration is adjacent to the center of the shifting area 130.

Figure 4:
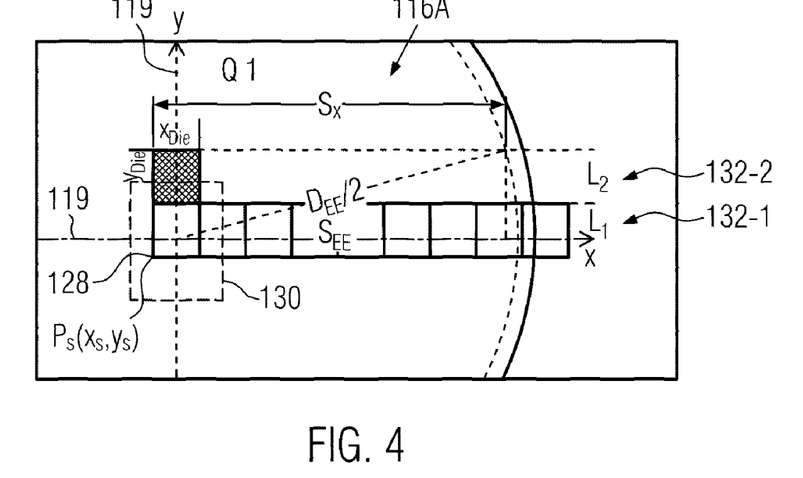
FIG. 4 illustrates in a schematic manner principles of a method of counting die in accordance with illustrative embodiments disclosed herein.

FIG. 4 shows the geometric relation which may be used for calculating the number of die per level within the wafer field 118. Reference number 119 denotes a wafer stage coordinate system of a lithography system. The first die will be placed with the left lower corner in quarter 1 covering starting point $P_s$. Afterwards, the first level will be filled with die. This approach will be repeated for all levels in the first quarter 116A. According to the sentence of Pythagoras, the following generalized equation may be defined [for starting point $P_s(x_s, y_s)$ with Level $L_{i,Q}=i$ ($i \in Z \setminus \{0\}$) and quarter Q ($1 \leq Q \leq 4$)]. Herein "$\epsilon$" is the mathematical symbol for "is element of" and "$Z \setminus \{0\}$" is the set of integers without zero.

$$\left(\frac{D_{EE}}{2}\right)^2 = (s_{EE})^2 + [y_s + (y_{Die} \cdot L_{i,Q})]^2 \tag{1.1}$$

wherein $s_{EE}$ is the orthogonal projection of the radius of wafer edge exclusion $D_{EE}/2$ onto the x-axis. With correlation $s_x = s_{EE} - x_s$ the die count equation depending on level may be expressed as:

$$(N_{Die})_{i,Q} = \left\lfloor \frac{s_x}{x_{Die}} \right\rfloor = \left\lfloor \frac{\left(\sqrt{\left(\frac{D_{EE}}{2}\right)^2 - [y_s + (y_{Die} \cdot L_{i,Q})]^2}\right) - x_s}{x_{Die}} \right\rfloor \tag{1.2}$$

wherein the brackets $\lfloor \ldots \rfloor$ denote the formation of an integer via round down. The maximum number of levels w (within $D_{EE}$) in ±y-direction (in point $x_s$) may be determined with $$w = \pm \left\lfloor \frac{\left(\frac{D_{EE}}{2} - y_s\right)}{y_{Die}} \right\rfloor$$

via round down. Thereby level w will be allocated with a positive sign for quarter 1 and 2. Quarter 3 and 4 are calculated with a negative sign.

The area of validity will be defined for the control variable i as $-w \leq i \leq w$.

The calculation according to Equation 1.2 will be executed for every quarter Q. The sum of the results of the four quarters points out the total number of die $N_{Die}$ per wafer for starting point $P_s(x_s, y_s)$.

$$N_{Die}(x_s, y_s) = \sum_{Q=1}^{2}\left(\sum_{i=1}^{w}(N_{Die})_{i,Q}\right) + \sum_{Q=3}^{4}\left(\sum_{i=-1}^{-w}(N_{Die})_{i,Q}\right) \tag{1.3}$$

The number of die calculation for $N_{Die\&Edge}$ with full wafer coverage is done with similar geometrical relations. Thereby the maximal level number u for full wafer coverage in ±y-direction (in point $x_s$) is defined as $$u = \pm \left\lceil \frac{\left(\frac{D_{Wfr}}{2} - y_s\right)}{y_{Die}} \right\rceil$$

rounded up; wherein the brackets ⌈ . . . ⌉ denote the formation of an integer via round up.

The area of validity will be defined for the control variable i as $-u \leq i \leq u$. The die count equation for $N_{Die\&Edge}$ per level $L_i$ and quarter Q can be expressed as $$N_{Die\&Edge}(x_s, y_s) = \sum_{Q=1}^{2}\left(\sum_{i=1}^{u}(N_{Die\&Edge})_{i,Q}\right) + \sum_{Q=3}^{4}\left(\sum_{i=-1}^{-u}(N_{Die\&Edge})_{i,Q}\right) \quad (1.4)$$

Figure 5:
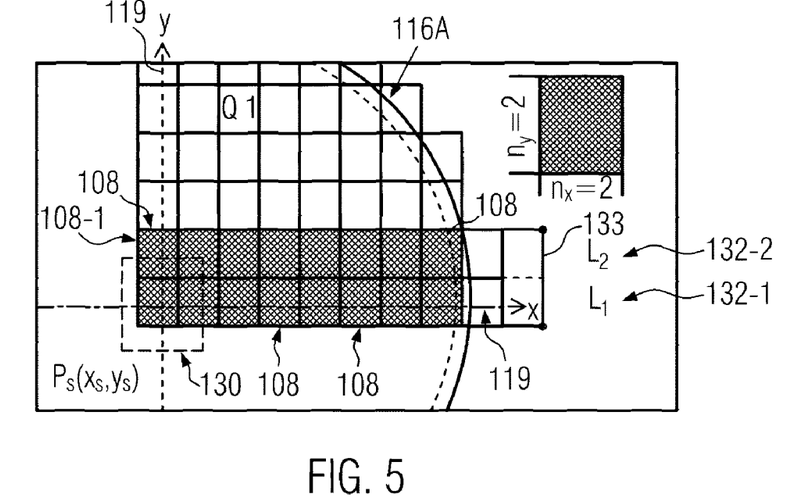
FIG. 5 illustrates in a schematic manner a method of counting exposure fields in accordance with illustrative embodiments disclosed herein.

Equations 1.3 and 1.4 may be used for determination of the number of exposure fields for the starting point $P_s(x_s, y_s)$. The counting of the number of exposure fields may be performed similarly to the counting of the number of die. According to illustrative embodiments, the counting of the number of exposure fields per wafer will be done for every quarter and every exposure field layer. An exposure field layer 133 consists of a defined number of levels which result from the number of die $n_y$ per exposure field in y-direction. According to illustrative embodiments shown in FIG. 5, the number of die $n_x$ per exposure field in x-direction is 2 and the number of die $n_y$ per exposure field in y-direction is also 2. Hence, the exposure field layer 133 comprises two die levels 132-1, 132-2. According to an illustrative embodiment, the first exposure field 108-1 will be selected as the exposure field of the first quarter 116A which abuts the center of the wafer 102 or the center of the wafer stage, respectively. According to an illustrative embodiment, the center of the wafer stage coincides with the origin of the coordinate system of the wafer stage. According to an illustrative embodiment, the first exposure field 108-1 is placed with the left lower corner in the first quarter 116A covering the starting point $P_s$. Afterwards, the first level $L_1$ of the first exposure field 108-1 is counted. This approach will be repeated for all layers in the first quarter 116A. All exposure fields which contain at least one complete die are counted to $N_{Field\ (Die)}$, as indicated by the four black exposure fields in FIG. 5. If the die of an exposure field are located on the wafer edge without full wafer coverage, the respective exposure field counts to the number $N_{Field\ (Die\&Edge)}$.

According to illustrative embodiments, the following equations may be used to determine the number of exposure fields for every single quarter 116A, 116B, 116C, 116D for the starting point $P_s(x_s, y_s)$. Thereby, it may be checked for every single level $L_i = i$ (with $i \in Z\backslash\{0\}$) per quarter, whether a complete exposure field layer can be placed in y-direction.

The following calculations determine the number of exposure fields for every single quarter ($1 \leq Q \leq 4$) for the starting point $P_s(x_s, y_s)$. Thereby, it has to be checked for every single level $L_i = i$ (with $i \in Z\backslash\{0\}$) per quarter, whether a complete exposure field layer can be placed in y-direction.

Following condition has to be true:

$$\left(\frac{L_i}{n_y}\right) \in Z$$

As far as the condition is valid, the calculations are executed per exposure field layer.

The area of validity will be defined for the control variable i as $-u \leq i \leq u$. The value $n_x$ defines the number of die per exposure field in x-direction.

$$N_{Field(Die)}(x_s, y_s) = \sum_{Q=1}^{2}\left(\sum_{i=1}^{u}\frac{(N_{Die})_{i,Q}}{n_x}\right) + \sum_{Q=3}^{4}\left(\sum_{i=-1}^{-u}\frac{(N_{Die})_{i,Q}}{n_x}\right) \quad (1.5)$$

$$N_{Field(Die\&Edge)}(x_s, y_s) = \sum_{Q=1}^{2}\left(\sum_{i=1}^{u}\frac{(N_{Die\&Edge})_{(i-n_y+1),Q}}{n_x}\right) + \sum_{Q=3}^{4}\left(\sum_{i=-1}^{-u}\frac{(N_{Die\&Edge})_{(i+n_y-1),Q}}{n_x}\right) \quad (1.6)$$

According to an illustrative embodiment, the calculations are made for $10^6$ starting points which are spaced by the respective x-increments and y-increments. As before, an x-increment is the stepping distance within the shifting area 130 in x-direction and the y-increment is stepping distance within the shifting area within y-direction. As an optimization parameter, values of which may be used for selecting a wafer layout as an optimized wafer layout, may serve each of: the number $N_{Die}$ of die of the wafer layout which are located within the wafer field 118; the number $N_{Field(die)}$ of exposure fields of the wafer layout which are within the wafer field 118; the number $N_{Die\&Edge}$ of die of the wafer layout for complete wafer coverage; the number $N_{Field(Die\&Edge)}$ of exposure fields of the wafer layout for complete wafer coverage. In illustrative embodiments, the number of exposure fields $N_{Field(die)}$ or $N_{Field(Die\&Edge)}$ is determined independently without determination of the number of die $N_{Die}$ or $N_{Field(die)}$.

According to an illustrative embodiment, all results of all starting points are analyzed where the number of die is maximum and the number of exposure fields is minimum.

The offset between the exposure system origin P(0,0) and the optimal starting point is called "matrix shift". The matrix shift will be determined for the x-direction and the y-direction.

The principles and embodiments disclosed herein have a variety of applications. One application is, as already discussed above, a wafer layout optimization model which allows determining an optimized wafer layout for a given die size and a given exposure field size. Further, the method further allows an optimal wafer edge exclusion analysis for a given product geometry. Another application of the principles disclosed herein is to determine an optimal x-y die size ratio which maximizes the number of die per wafer and/or minimizes the number of exposure fields per wafer.

Figure 6A:
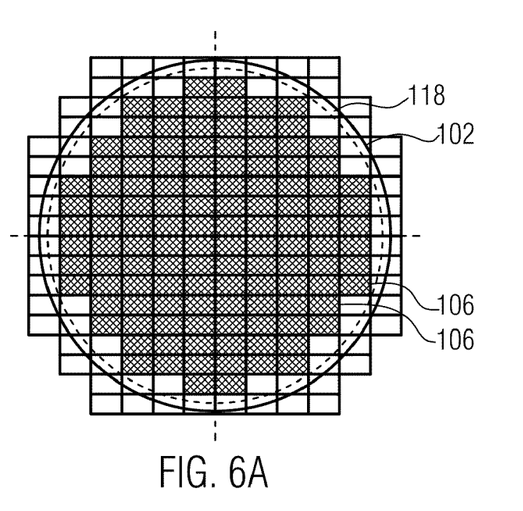
FIG. 6A schematically shows a wafer with an optimized die layout obtained in accordance with illustrative embodiments disclosed herein.
Figure 6B:
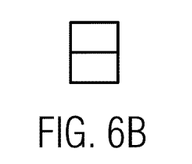
FIG. 6B illustrates a exposure field used for exposing the wafer illustrated in FIG. 6A.

FIG. 6A shows the result of optimizing a wafer layout according to an illustrative embodiment where the number of die per wafer is maximized and the number of exposure fields per wafer is minimized for a given die size and a given exposure field size. The wafer diameter in the example is 200 mm, the edge clearance is 5 mm, the x-die size is 16.964 mm, the y-die size is 11.141 mm, the x-exposure field size is 17.124 mm, the y-exposure field size is 22.602 mm and the number of die per exposure field is 1 in the x-direction and is 2 in the y-direction, as illustrated in FIG. 6B. Generally, as is the case in, for example, FIGS. 6A and 6B, the size of the exposure field in the x- and y-directions does not need to be an integer multiple of the size of the die in the x- and y-directions. In contrast, usually the exposure field size will be slightly larger than the die size in the respective direction. It should be understood that, for a determination of the number of die, this spacing of the die is taken into account, e.g., by using an effective die size which incorporates the space in between the die.

The optimized result in FIG. 6A obtained by employing illustrative embodiments yields a number of 123 die within the wafer field 118. In total, 187 die have been exposed. There have been 57 inner shots, 9 partial shots of which only 1 die is within the wafer field 118. Further, there have been 30 wafer coverage shots yielding a total number of 96 shots. As mentioned above, inner shots include exposures where all die of a reticle field are exposed within the wafer field 118. Partial shots include exposures where only part of the die of a reticle field are exposed within the wafer field 118. Full-wafer-coverage shots include exposures which expose a part of the wafer 102 but do not expose a die within the wafer field 118. The full-wafer-coverage shots further include the die of the inner shots and the die of the partial shots.

Another application of the present invention is the analysis of the impact of the wafer edge clearance on the number of die per wafer, the yield shots per wafer and the total shots per wafer. In an illustrative embodiment, the analyzed range for edge clearance has been 3-10 mm with a stepping distance of 0.1 mm. Possible optimization parameters may be at least one of a maximum number of die per wafer, a minimum number of yield shots and a minimum number of total shots. Herein, a yield shot is an exposure of an exposure field which fully contributes to the number of die within a wafer field 118.

Figure 7:
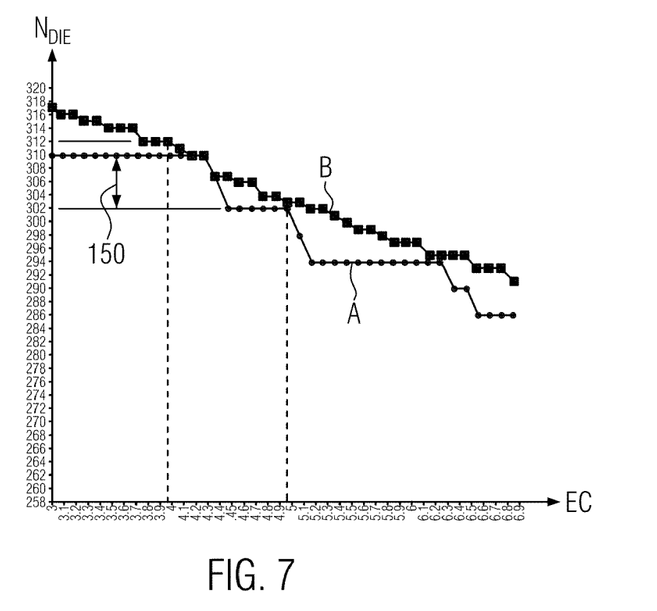
FIG. 7 schematically shows a graph depicting the dependence of a maximum number of die $N_{Die}$ for two different calculation methods versus the wafer edge clearance EC.

According to one illustrative embodiment, with each change of the edge clearance, the matrix shift is maintained and the number of die is newly calculated. This approach leads to the curve A in FIG. 7 wherein the number of die within the wafer field 118 is drawn over the edge clearance EC. According to other illustrative embodiments, with each change of the edge clearance, the matrix shift and the number of die are both newly calculated. This approach leads to the curve B in FIG. 7. As is further apparent from FIG. 7, in the illustrative embodiment, the reduction of the wafer edge clearance from 5 mm to 4 mm increases the maximum number of die within the wafer field 118 by 10, as indicated by the arrow 150.

Figure 8:
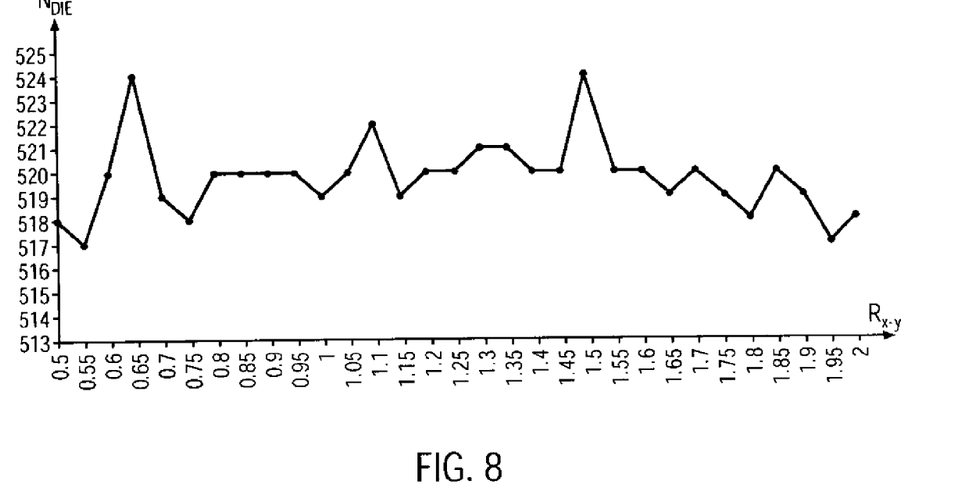
FIG. 8 schematically shows a graph depicting the dependence of a maximum number of die $N_{Die}$ versus the x-y-die-size ratio $R_{x-y}$.

Another application of the principles of the present invention and embodiments thereof is the analysis of an x-y-die-size ratio $R_{x-y}$ of the die 106. In this x-y-die-size ratio, $R_{x-y}$ of the die is the ratio of the die width 111 and the die height 113 (FIG. 1B), i.e., the dimension of the die 6 in the x-direction and the y-direction, respectively, in an illustrative embodiment. An exemplary result of such an analysis is depicted in FIG. 8. Herein the number of die $N_{Die}$ within the wafer field 118 may be increased by choosing an optimum x-y-die-size ratio $R_{x-y}$, e.g., of 0.65 or 1.5 in the illustrative embodiment.

Figure 9:
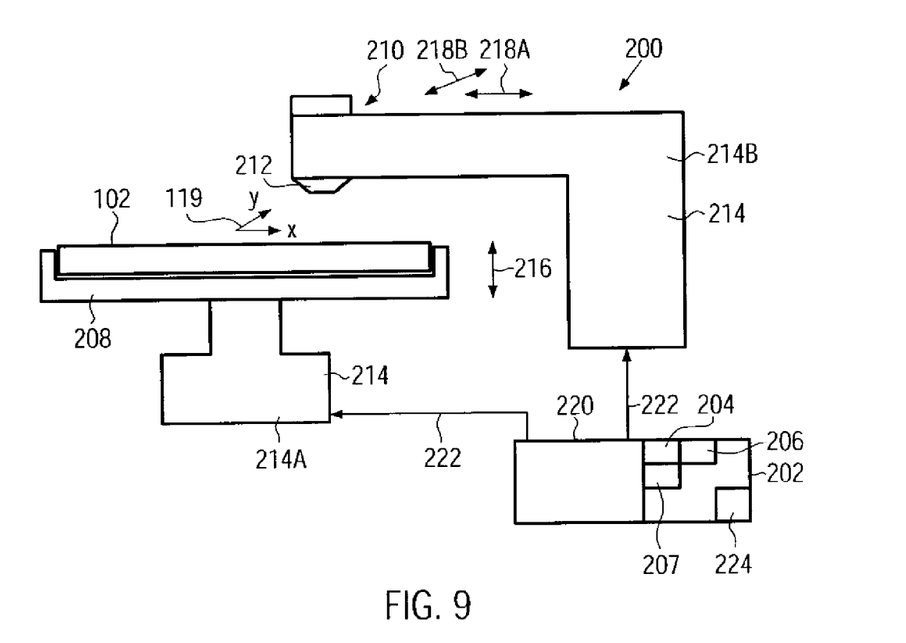
FIG. 9 shows a sketch of a lithography system according to illustrative embodiments disclosed herein.

FIG. 9 shows an illustrative embodiment of a lithography system 200 comprising a wafer layout system 202. The wafer layout system 202 comprises a layout generator 204 for generating at least two wafer layouts for a wafer 102, each wafer layout defining the location of a plurality of die with regard to the wafer 102. The wafer layout system further comprises an analyzer 206 for determining an optimization parameter value of at least one optimization parameter for each of the at least two wafer layouts. Herein, the term "at least one optimization parameter" may include optimization parameters as disclosed above. Further, the wafer layout system 202 comprises a decision unit 207 selecting one of the at least two wafer layouts as optimized wafer layout depending on the optimization parameter values.

The layout generator 204 is configured for generating a wafer layout by specifying a spatial relationship between the wafer 102 and the predetermined die arrangement pattern 120. According to an illustrative embodiment, the layout generator is configured for generating different positions of the reference point 128 of the die arrangement pattern 120 with respect to the wafer 102. The positions of the reference points 128 of the die arrangement pattern 120 are located within the shifting area 130, the size of which corresponds to the exposure field 108. According to other illustrative embodiments, the layout generator 204 is configured for generating wafer layouts having different values of wafer edge clearance.

According to another illustrative embodiment, the layout generator 204 is configured for generating wafer layouts, the die of which have different x-y-die-size ratios $R_{x-y}$.

The lithography system 200 further comprises a wafer stage 208 for receiving the wafer 102. Reference number 119 denotes the coordinate system of the wafer stage 208. It should be understood that the x-axis and the y-axis of the wafer stage coordinate system parallel a surface of a wafer 102 received in the wafer stage 208. The system 200 further comprises a lithography tool 210 which defines the exposure field 108 on a wafer that is exposable by the lithography tool 210 in an exposure step. The lithography tool 210 comprises an optical component 212 for emitting an exposure pattern defining the exposure field 108 and the die 106 included in the exposure field 108. The system 200 further comprises a drive assembly 214 for moving the wafer stage 208 and the emitting system 212 relative to each other. In the exemplary embodiment shown in FIG. 9, the drive assembly 214 comprises a wafer-related drive assembly 214A for moving the wafer stage in at least one direction. Further, the drive assembly 214 of the system 200 comprises an imaging system related to a drive assembly 214B for moving the imaging system 212 in at least one direction. According to other embodiments, the drive assembly 214 of the system 200 comprises only one of the wafer related drive assemblies 214A and the imaging system related drive assembly 214B. The drive assemblies may be capable of providing a linear movement. According to other illustrative embodiments, the drive assembly 214 may be capable of providing a rotational movement of the respective component 208, 212. According to still other illustrative embodiments, the drive assembly 214 may be capable of both linear and rotational movement of the respective components 208, 212. According to one illustrative embodiment, the imaging system related drive assembly 214B is capable of moving the imaging system 212 over the wafer 102, i.e., it is capable of moving the imaging system 212 in a plane parallel to the wafer 102. In one illustrative embodiment, the wafer related drive system 214 is capable of moving the wafer stage 208 forward and away from the imaging system 208, e.g., in a vertical direction as illustrated in FIG. 9 by the arrow 216. The movability of the imaging related drive system 214B in a plane parallel to the wafer surface of the wafer 102 is indicated at 218A, 218B.

The system 200 illustrated in FIG. 9 further comprises a control unit 220 for providing control signals 222 to the drive assemblies 214 to move the optical component 212 with respect to the wafer 102 to thereby expose the wafer fields 108 on the wafer 102 in accordance with an optimized wafer layout determined by the wafer layout system 202.

Instead of being included in the lithography system 200 or in another system, the wafer layout system may be a separate device, e.g., a computer having a respective software running on it. The wafer layout system 202 may include an interface 224 for receiving geometric parameter values of geometric parameters, e.g., of a wafer diameter, a diameter of an edge exclusion, a diameter of shot clearance, die dimensions, exposure field dimensions, a number of die per exposure field in the x-direction, a number of die per exposure field in the y-direction, etc. The interface may include a user interface, e.g., a keyboard, a touch screen, etc. According to other illustrative embodiments, the interface may include a data communication interface for data communication of the wafer layout system 202 with other components in the wafer fabrication line or outside the wafer fabrication line.

Any method disclosed herein may be realized in software or in hardware. For example, a computer program product may be provided which enables one or more processors to carry out the respective method. Accordingly, components of a wafer layout system 202 such as the layout generator 204, the analyzer 206, the decision unit 207 or the interface 224 may be realized in hardware or in software. According to illustrative embodiments, the wafer layout system comprises at least one processor and a computer program product which enables the processor to provide the functions of the respective components of the wafer layout system 202, e.g., the layout generator 204, the analyzer 206, the decision unit 207 or the interface 224.

As a result, the subject matter disclosed herein provides various methods and systems for optimizing a wafer layout by taking into account as an optimization parameter at least one of a maximum number of die and a minimum number of exposure fields. According to illustrative embodiments, the maximum number of die and the minimum number of exposure fields are both used as an optimization parameter. The maximum number of die may be taken into account with a higher priority than the minimum number of exposure fields. For determining an optimized wafer layout, at least two wafer layouts are specified for a given wafer, each wafer layout defining the location of a plurality of die with regard to the wafer. An optimization parameter value of at least one optimization parameter is determined for each of the at least two wafer layouts. The at least one optimization parameter includes at least one of a number of exposure fields necessary for exposing the respective wafer layout and a number of die of the wafer layout. The optimized wafer layout is selected out of the at least two wafer layouts depending on the optimization parameter values.

Further, a model for calculating the number of die of a given wafer layout or for calculating the number of exposure fields of a given wafer layout is provided. The model calculates the respective number for each quarter of the wafer and within each quarter sequentially for each level, i.e., for each row of die or exposure fields of the wafer layout. According to illustrative embodiments, a wafer stage coordinate system is chosen, the origin of which lies in the center of the wafer stage, thereby defining four equal quarters of the wafer if the wafer is of circular shape. According to illustrative embodiments, different wafer layouts are determined by shifting a predetermined die arrangement pattern with respect to the wafer, wherein, in an illustrative embodiment, a reference point of the die arrangement pattern coincides with the origin of the wafer stage coordinate system and the shift of the predetermined die arrangement pattern with regard to the wafer is such that the reference point resides within a shifting area, the size of which corresponds to the exposure field used for exposing the die arrangement pattern onto the wafer. Herein the center of the shifting area coincides with the origin of the wafer stage coordinate system. The first die or exposure field for starting the actualization of the respective number is selected to be the die or exposure field that joins the origin of the wafer stage coordinate system in the unshifted configuration where the reference point of the predetermined die arrangement pattern coincides with the origin of the wafer stage coordinate system. By using a geometric relation for the calculation of the number of die or the number of exposure fields, the calculation can be performed efficiently such that a large number of wafer layouts may be taken into account for determining an optimized wafer layout.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   specifying at least two wafer layouts for a wafer, each wafer layout defining a location of a plurality of die with regard to said wafer;
   using a computing apparatus to determine an optimization parameter value of at least one optimization parameter for each of said at least two wafer layouts, wherein said at least one optimization parameter comprises at least a minimum number of exposure fields necessary for exposing the respective wafer layout, wherein said exposure field is defined by a lithography tool and comprises at least one die; and
   selecting one of said at least two wafer layouts as an optimized wafer layout based on said at least one optimization parameter value.

2. The method of claim 1 wherein, in said at least two wafer layouts, the die are arranged in parallel with respect to axes of a Cartesian coordinate system.

3. The method of claim 1, wherein said at least two wafer layouts differ from each other by a translatory displacement and/or a rotational displacement.

4. The method of claim 3, wherein said at least two wafer layouts comprise a plurality of wafer layouts differing from each other by a translatory shift, wherein the translatory shift is within a shifting area corresponding in size to said exposure field.

5. The method of claim 4, wherein each translatory shift defines a position of a reference point of a die arrangement pattern with respect to said wafer and said positions of said reference point are equidistantly spaced over said shifting area.

6. The method of claim 4, wherein said shifting area is located at a center of said wafer.

7. The method of claim 1, wherein a subtotal of exposure fields calculated separately for each of four quarter sections of said wafer and said minimum number of exposure fields is calculated as a sum of said four respective subtotals.

8. The method of claim 7, wherein said at least one optimization parameter further comprises a maximum number of die of said respective wafer layout.

9. The method of claim 8, wherein a subtotal of die is calculated separately for each of said four quarter sections of said wafer and said maximum number of die is calculated as a sum of said four respective subtotals.

10. The method of claim 1, wherein said at least two wafer layouts differ in a wafer edge clearance with regard to a predetermined wafer size.

11. The method of claim 1, wherein:
said at least two wafer layouts differ with regard to an x-y-die-size ratio of said die;
said x-y-die-size ratio of said die is the ratio of an extent of the die in an x direction to an extent of the die in an y direction; and
said x direction and said y direction are perpendicular with respect to each other.

12. A method of optimizing a wafer layout, the method comprising:
defining a predetermined geometry parameter set, said predetermined geometry parameter set comprising a die size and an available wafer field size of a wafer field, the wafer field of a wafer specifying an area to be used for die manufacturing;
defining a predetermined die arrangement pattern, wherein a wafer layout is obtained by specifying a spatial relationship between the wafer and the die arrangement pattern, the wafer layout including all die of said predetermined die arrangement pattern exposable within said wafer field; and
using a computing apparatus to determine an optimized wafer layout defining a respective optimized spatial relationship between the wafer and the predetermined die arrangement pattern, said optimized wafer layout comprising a minimum number of exposure fields necessary to expose the optimized wafer layout on said wafer, wherein each exposure field is defined by a lithography tool and comprises at least one die.

13. The method of claim 12, wherein said spatial relationship between the wafer and the die arrangement pattern is changed by shifting a wafer-stage-coordinate system against a lithography-tool-coordinate system.

14. The method of claim 12 wherein said spatial relationship between the wafer and the die arrangement pattern is changed by shifting said wafer with regard to said die arrangement pattern and said shifting is performed within an area corresponding to said exposure field.

15. The method of claim 12 wherein, in said predetermined die arrangement pattern, the die are arranged in parallel with respect to axes of a Cartesian coordinate system.

16. The method of claim 12, wherein said predetermined geometry parameter set further comprises at least one of a wafer diameter, a diameter of wafer edge exclusion, a die dimension in x direction, a die dimension in y direction, an exposure field dimension in x direction, exposure field size in y direction, a number of die in x direction over the full extent of said wafer, a number of die in y direction over the full extent of said wafer; a number of die in x direction over the extent of said wafer field size, a number of die in y direction over the extent of said wafer field size and wherein said x direction and said y direction are perpendicular with respect to each other.

17. The method of claim 12, said optimized wafer layout further comprising a maximum number of die in said wafer field.

18. A wafer layout system, comprising:
a layout generator for generating at least two wafer layouts for a wafer, each wafer layout defining a location on said wafer of a plurality of die;
an analyzer for determining an optimization parameter value of at least one optimization parameter for each of said at least two wafer layouts, wherein said at least one optimization parameter comprises at least a minimum number of exposure fields necessary for exposing the respective wafer layout and
a decision unit selecting one of said at least two wafer layouts as an optimized wafer layout based on said at least one optimization parameter value.

19. The system of claim 18, wherein said layout generator is configured for generating a wafer layout by specifying a spatial relationship between a wafer and a predetermined die arrangement pattern.

20. The system of claim 19, wherein said layout generator is configured for generating positions of a plurality of reference points of said die arrangement pattern with respect to said wafer and wherein said positions of said plurality of reference points are located within shifting area corresponding to said exposure field.

21. The system of claim 18, wherein said layout generator is configured for generating wafer layouts having different values of wafer edge clearance.

22. The system of claim 18, wherein:
said layout generator is configured for generating wafer layouts the die of which have different x-y-die-size ratios;
said x-y-die-size ratio of said die is the ratio of the extent of the die in an x direction to the extent of the die in an y direction; and
said x direction and said y direction are perpendicular to each other.

23. The wafer layout system of claim 18, wherein said at least one optimization parameter further comprises a maximum number of die of said respective wafer layout.

* * * * *